United States Patent [19]

McBride et al.

[11] Patent Number: 4,987,100
[45] Date of Patent: Jan. 22, 1991

[54] FLEXIBLE CARRIER FOR AN ELECTRONIC DEVICE

[75] Inventors: Donald G. McBride, Binghamton; Theron L. Ellis, Vestal, both of N.Y.

[73] Assignee: International Business Machines Corporation, Armonk, N.Y.

[21] Appl. No.: 429,807

[22] Filed: Oct. 30, 1989

Related U.S. Application Data

[62] Division of Ser. No. 198,901, May 26, 1988, Pat. No. 4,937,707.

[51] Int. Cl.$^5$ .............................................. H01L 21/60
[52] U.S. Cl. ..................... 437/206; 437/209; 437/220
[58] Field of Search ............... 437/206, 207, 220, 205, 437/209, 225, 180, 222, 228, 235, 245

[56] References Cited

U.S. PATENT DOCUMENTS

| | | | |
|---|---|---|---|
| 3,118,016 | 1/1964 | Stephenson, Jr. | 361/421 |
| 3,469,684 | 9/1969 | Keady et al. | 361/421 X |
| 3,777,220 | 12/1973 | Tatusko et al. | 317/101 A |
| 3,969,754 | 7/1976 | Kuniya et al. | 357/65 |
| 4,052,787 | 10/1977 | Shaheen et al. | 437/245 |
| 4,189,524 | 2/1980 | Lazzari | 428/622 |
| 4,231,154 | 11/1980 | Gozdik et al. | 29/840 |
| 4,396,457 | 8/1983 | Bakermans | 437/220 |
| 4,413,308 | 11/1983 | Brown | 361/398 |
| 4,420,767 | 12/1983 | Hodge et al. | 357/81 |
| 4,480,288 | 10/1984 | Gazdik et al. | 361/398 |
| 4,489,923 | 12/1984 | Barresi et al. | 269/8 |
| 4,509,096 | 4/1985 | Baldwin et al. | 361/386 |
| 4,591,659 | 5/1986 | Leibowitz | 174/68.5 |
| 4,626,805 | 12/1986 | Jones | 333/33 |
| 4,640,866 | 2/1987 | Suzuki | 428/422 |
| 4,681,654 | 7/1987 | Clementi | 174/68.5 X |
| 4,716,124 | 12/1987 | Yerman et al. | 174/52.4 |
| 4,755,417 | 7/1988 | Detoma | 174/68.5 X |
| 4,774,127 | 9/1988 | Reagan et al. | 174/68.5 X |
| 4,791,239 | 12/1988 | Shirahata et al. | 174/68.5 |
| 4,791,248 | 12/1988 | Oldenttel | 174/68.5 |
| 4,810,563 | 3/1989 | DeGree et al. | 174/68.5 X |

Primary Examiner—Olik Chaudhuri
Assistant Examiner—David E. Graybill
Attorney, Agent, or Firm—Douglas M. Clarkson

[57] ABSTRACT

The disclosure describes a form of packaging for an electronic device and a method of achieving it in order to overcome the problem of damage because of cycles in environmental temperature.

A thin, flexible foil functioning as a carrier of electrically conductive material selected from the group including Invar, copper-Invar-copper and Kovar is coated with a preselected polyimide, on which is formed a thin metallized coating of chromium, in the order to 200 Angstroms, and copper, in the order of 80,000 Angstroms.

A predetermined electrical circuit is formed out of this metallized coating by a photolithographic process and is connected electrically to the flexible metal foil by vias through the polyimide coating. At least one electronic device is bonded to the electrical circuit at a predetermined location to operate functionally with the circuit, and both the device and the circuit are connected electrically by the vias to the thin, metal carrier which functions as a power plane for the package.

11 Claims, 1 Drawing Sheet

FLEXIBLE CARRIER FOR AN ELECTRONIC DEVICE

This is a division of Ser. No. 198,901 filed May 26, 1988, now U.S. Pat. No. 4,937,707.

BACKGROUND OF THE INVENTION

1. Field of the Invention

The present invention, generally, relates to the packaging of electronic devices and, more particularly, to a first level electronic package, and method of making the same, for carrying an electronic device.

In recent years, the electronics industry has grown, improved and developed in its advance of the technology that it uses; and the technology involving the packaging of circuit components is advancing now with matching speed. For example, one monolithic chip measuring less than one-half inch square today can store one million bits of information, and in addition, such a chip can have many electronic circuits. Placing more and more electronic circuits on smaller and smaller chips makes the task of packaging these smaller chips with a module, approach the impossible.

A major restriction in attaching a device to a module seems to arise because of the mismatch in the respective coefficients of thermal expansion. This mismatch causes fractures and other circuit discontinuities in the electrical interconnections during thermal cycling. For example, the coefficient of thermal expansion for a typical chip is in the order of 3 microinches per inch per degree Centigrade, while that of a typical ceramic module is in the order of 7 microinches per inch per degree Centigrade.

These fractures and other circuit discontinuities are the results of stresses that are developed when there is thermal cycling involved in their environment. This problem is compounded even further when a device is affixed rigidly to a module, as they are so frequently. The prior art is rich with efforts to solve the problems that arise from these thermal mismatches.

2. Description of the Prior Art

U.S. Pat. No. 3,777,220 to Tatusko et al. teaches a unique structure formed of discrete areas with different coefficients of thermal expansion and suggests the attaching of devices to those areas more closely matching the coefficient of thermal expansion of the device. This may well be a great teaching, theoretically, but with today's subminiturized devices, it lacks practicality.

U.S. Pat. No. 3,969,754 to Kuniya et al. describes an arrangement whereby a supporting electrode has embedded fibers of a coefficient of thermal expansion "substantially equal to" that of a device to be attached. The idea may be sound, but it lacks a degree of universal applicability that is necessary to attract financial investors in today's market.

U.S. Pat. No. 4,189,524 to Lazzari describes a multilayer, rigid support composed of a very thin layer of conductive material with negligible thermal expansion inserted between each conductive layer and each insulating layer. When this prior patent teaches that the problem of elevations of temperatures "can be ignored", it leads diametrically opposite to the present invention.

U.S. Pat. No. 4,413,308 to Brown clearly recognizes the problem of providing a support for a chip to prevent solder joint failures due to stress and differential thermal expansion, but the solution that is suggested is only limited and incomplete as it concerns the continuing problem in the manufacture of electronic equipment using microcircuit chips.

The problem arises because of the requirement of mounting, or packaging, the chip in such a way as to provide adequate heat sinking of the chip while permitting ease of mechanical and electrical connection, and disconnection, between the package and its printed circuit board. Underlying the problem is the thermal incompatibility of the carrier material, usually ceramic in nature, and the typical printed circuit board, usually an epoxy or the like material.

A direct mounting of a chip carrier to a printed circuit board produces intolerable differential expansion that causes the above-described fractures or other discontinuities as a result of the stresses that are developed in these mounting connections during the normal cycles in temperature. As the above referred-to prior art patents indicate, there have been numerous approaches attempted in the past to solve this on-going problem, but until the present invention, none has appeared as totally effective.

OBJECTS AND SUMMARY OF THE INVENTION

A principal object of the present invention is to provide a new and improved flexible packaging structure for supporting an electronic device to overcome disadvantages inherent in prior structures.

It is also an important object of the invention to provide a method of fabricating a package for an electronic device to avoid operational limitations in an environment involving temperature cycling.

Briefly, a structure in accordance with the invention involves a carrier of electrically conductive material on which is formed a layer of electrically non-conductive material for supporting an electrical circuit in a predetermined array. The electrical circuit is of a form to permit bonding thereto at predetermined locations an electrical device to operate functionally with the circuit, and the carrier is arranged to function also in an electrical power conveying relationship with the electrical circuit.

Other features of the invention as well as additional objects and advantages will become more apparent from the following detailed description of the presently preferred embodiment which is described in conjunction with the accompanying drawings.

DETAILED DESCRIPTION OF THE INVENTION

As has been mentioned hereinabove, the manufacture of electronic circuits has encountered problems in the increasingly tightening spiral to make these circuits smaller and smaller. Today such circuits have past the miniturized state to arrive at a true subminiturized state, and the problems involved in the manufacturing end of the industry have been nearly as startling as the wonders produced by these circuits have been spectacular.

For example, to achieve the "stuffing" of electronic components into smaller and smaller spaces has developed a need for circuits to which these components are formed functionally to be increasingly more flexible. This miniaturization trend has reached a point where the mismatch in the coefficients of thermal expansion, between various silicon components and the carrier or other support to which they necessarily are attached, has stubbornly defied solution, that is, until this invention.

The coefficient of thermal expansion of silicon is approximately 3 micro inches per inch per degree Centigrade, and that of a ceramic substrate carrier is about 7 micro inches per inch per degree Centigrade. Therefore, when a silicon device is soldered directly to this ceramic substrate, this mismatch in their coefficients of thermal expansion causes the solder joint to crack during thermal cycling.

To make the substrate carrier of a very thin flexible material, taken alone without more, has proven to be effective. For example, see U.S. Pat. No. 4,231,154 which is assigned to the same Assignee as this invention. This thin film will not transfer a force to the solder connections during thermal cycling because the thin flexible material will itself buckle.

However, to achieve improved electrical performance of the package, a ground plane is required. But if a copper ground plane is used, then the coefficient of thermal expansion, which for copper is about 17 micro inches per inch per degree Centigrade, makes the mismatch problem even more severe.

Figure 1:
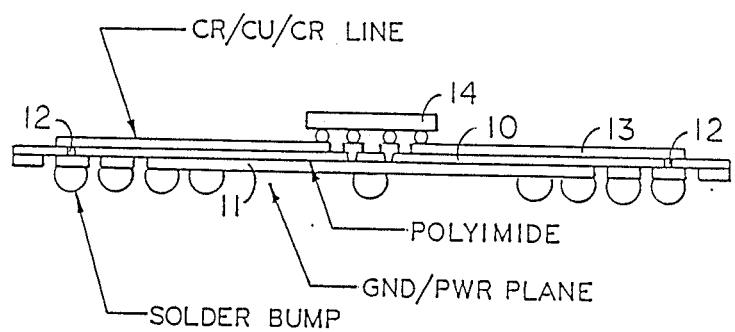
FIG. 1 is a view in cross section, taken in elevation, illustrating significant aspects of the invention for use in the following description.

A uniquely new structure is illustrated in FIG. 1 of the drawing and is formed by the method of the invention. According to the invention, a suitable insulating material 10, like Polyimide TEFLON, or a polytetrafluoroethylene composite is cast onto a metal carrier 11 layer of INVAR; a tradename for a NI/FE material. Paths are formed, called "vias", 12 in the TEFLON, and next, a metal film 13 is formed over the TEFLON. Finally, a desired circuit is formed of the metallized film.

Figure 2:
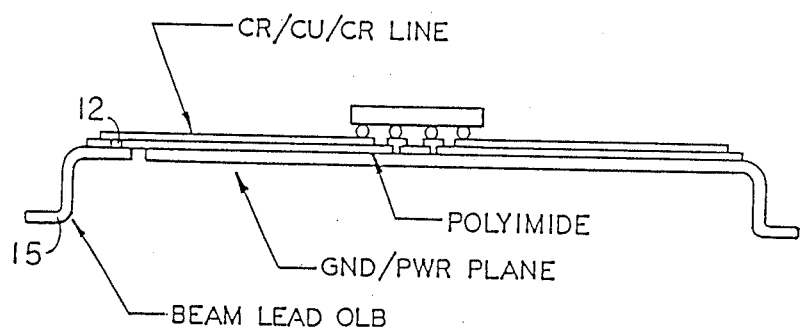
FIG. 2 is a view similar to FIG. 1 but illustrating another aspect of the invention as an aid in connection with the following description.

Of course, copper-INVAR-copper or KOVAR are acceptable substitutes for INVAR, because it is only necessary that this material have a coefficient of thermal expansion that is close to that of a particular device 14 to be bonded to the first level of this electronic package. To address the mismatch in coefficients of thermal expansion between the INVAR and the second level carrier (not shown), the Outer Lead Bonding (OLB) of leads 15 are formed in accordance with the aspect of the invention that is illustrated in FIG. 2 of the drawings. This view illustrates a "stress relieved" manner of arrangement, particularly for the outer leads.

The mismatch in coefficients of thermal expansion between a device, such as a chip, and the carrier is solved effectively by making the carrier of a very thin, low modulus material such as a polyimide film of approximately 5 microns in thickness.

However, if a second layer of metal is required, such as for a ground plane, then the second layer of metal must have a low coefficient of thermal expansion, much like that of the chip, to reduce the cracking joints due to thermal cycling. This aspect of the invention is described above.

Now, the low coefficient of thermal expansion metal needed to address the chip to carrier mismatch problem is the cause of a problem of mismatch between the carrier and the second level carrier, whether a card or a board. However, an arrangement in accordance with the present invention solves this mismatch problem effectively.

Multiple layers can be fabricated using the steps of the invention repeatedly. To illustrate the respective steps of the invention, they are:

1. An electrically insulating material, such as TEFLON (PTFE), is cast onto INVAR, copper INVAR or KOVAR or like metal material, which can be in sheet or roll form.

2. Using masking and etching techniques, which can be wet or dry, form paths (vias) through the TEFLON to the metal carrier material.

3. Metallize the TEFLON with chromium and copper chromium by any suitable technique, such as evaporation, sputtering or the like.

4. Form a predetermined electronic circuit on the metalized TEFLON, including circuit conductor paths, identified points for bonding devices, and other connector ends.

Multiple layers can be fabricated by using the above steps 1–4 repeatedly. The metal carrier is left in place and operates functionally as a means of connecting electrical power, including "ground", to the circuit as well as to the various devices.

A structure fabricated by the above-described method and as illustrated in the drawings permits the advantage that a chip, or other device or component, can be attached by bonding utilizing the connection process called Controlled Collapse Chip Connection (or "C-4"). This is a reflow solder process for bonding the input/output terminals of the device to the pads or other connection points preformed on the circuit.

In addition, a structure fabricated by the method of the invention permits bonding also by thermal compression techniques. In other words, the structure of the invention removes the heretofore limitations and restrictions as to the type of bonding that is appropriate.

The inventive structure also permits the leads for providing means of connection and interconnection between devices, components and the respective power plane, to be more dense. Even though these circuits and the devices attached to them are getting smaller and smaller, the power needs to operate them is increasing. Therefore, the present structure permits a significant advantage.

The particular chromium-copper-chromium foil has a thickness as follows:

chromium—approximately 200 Angstroms
copper—approximately 80,000 Angstroms
chromium—approximately 200 Angstroms As has been described hereinabove, in accordance with the principles of the invention, an insulation and a circuit pattern can be applied to both sides of a copper-INVAR-copper metal carrier. In a preferred arrangement, the copper-INVAR-copper metal carrier functions as a ground plane, and circuit lines that are ground potential are connected to this carrier.

Since a major part of this structure is metal, an efficient thermal conduction is obtained. Actually, even with the most basic form of this inventive structure, a one layer arrangement, the copper-INVAR-copper metal carrier can be attached to the frame of a machine, such as a computer, to achieve good heat transfer, if electrical insulation is provided.

With a multilayer arrangement of the inventive structure, the interleaved copper-INVAR-copper metal carrier planes form effective shields for the circuits from stray fields, particularly when these metal carrier planes are used for ground potential connections.

The polyimide as described herein that is suitable for use with a structure according to the invention is manufactured commercially by DuPont de Nemours, E. I. and Company and is identified as DuPont Polyimide 5878. KOVAR is a registered trademark of Westinghouse Electric Corporation and, as such, identifies a NI/CO/FE/MG composition.

The flexible carrier structure of the present invention and the method of fabricating same have been shown, described and illustrated in substantial detail in accordance with the presently preferred embodiment. It is understood that changes, alterations and modifications will occur to one skilled in this art in view of this description, but all such changes, alterations and modifications that come within the spirit and scope of the appended claims are within the present invention.

What is claimed is:

1. The method of making an electronic package assembly, comprising the steps of:
    providing a flexible carrier of an electrically conductive material;
    forming a layer on said flexible carrier of an electrically insulating material;
    forming vias in said layer of electrically insulating material at predetermined locations through to communicate with said flexible carrier;
    metallizing said layer of electrically insulating material to include said vias; and
    forming an electronic circuit from said metallization of said insulating material.

2. The method of making an electronic package assembly as described in claim 1 wherein said step of forming vias in said insulating material includes the steps of masking and etching.

3. The method of making an electronic package assembly as described in claim 2 wherein said step metallizing said insulating material comprises an evaporation process.

4. The method of making an electronic package assembly as described in claim 3 wherein said step of forming an electronic circuit from the metallization of said layer of insulating material comprises a photolithographic process.

5. The method of making an electronic package assembly as described in claim 4 wherein said insulating material includes a polyimide: said metallizing step includes the use of a chromium and copper chromium material with thicknesses in the range of 200 Angstroms and 80,000 Angstroms, respectively; and bonding a electronic device to said electronic circuit using a Controlled Collapse Chip Connection process; so that said flexible carrier is functionally operable as a power plane for said electrical circuit and for said electronic device.

6. The method of making an electronic package assembly as described in claim 5 including the step of providing stress relief between said flexible carrier and a second level carrier by locating pre-formed bent leads over said electrically insulating layer, where said carrier has been selectively removed.

7. The method of making an electronic package assembly as described in claim 5 including the step of providing stress relief between said flexible carrier and a second level carrier by locating an elastic cross section of circuitry over said electrically insulating layer, where said carrier has been selectively removed.

8. The method of making an electronic package assembly as described in claim 1 wherein said step of forming a layer of said flexible carrier includes the forming of said carrier from a material including NI/FE.

9. The method of making an electronic package assembly as described in claim 1 wherein said step of forming a layer of said flexible carrier includes the forming of said carrier from a material including CU-NI/FE-CU.

10. The method of making an electronic package assembly as described in claim 1 wherein said step of forming a layer of said flexible carrier includes the forming of said carrier from a material including NI/CO/FE/MG.

11. The method of making an electronic package assembly as described in claim 1 wherein said step of forming a layer of said flexible carrier includes the forming of said carrier from a material including CU-NI/CO/FE/MG-CU.

* * * * *